(12) United States Patent
Wang et al.

(10) Patent No.: US 6,726,955 B1
(45) Date of Patent: Apr. 27, 2004

(54) METHOD OF CONTROLLING THE CRYSTAL STRUCTURE OF POLYCRYSTALLINE SILICON

(75) Inventors: Shulin Wang, Campbell, CA (US); Steven A. Chen, Fremont, CA (US); Lee Luo, Fremont, CA (US); Errol Sanchez, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/605,518

(22) Filed: Jun. 27, 2000

(51) Int. Cl.$^7$ ................................................ C23C 16/24
(52) U.S. Cl. ................ 427/255.27; 427/99; 427/255.7; 427/255.392
(58) Field of Search ................ 427/255.27, 99, 427/255.7, 255.392

(56) References Cited

U.S. PATENT DOCUMENTS

| | | | |
|---|---|---|---|
| 4,374,163 A | * | 2/1983 | Isenberg ...................... 427/253 |
| 5,064,779 A | | 11/1991 | Hasegawa |
| 5,094,885 A | * | 3/1992 | Selbrede .................. 427/248.1 |
| 5,272,096 A | * | 12/1993 | De Fresart et al. ........... 437/31 |
| 5,324,684 A | | 6/1994 | Kermani et al. |
| 5,389,580 A | * | 2/1995 | Miyasaka .................... 437/233 |
| 5,470,619 A | * | 11/1995 | Ahn et al. .............. 427/255.19 |
| 5,498,904 A | * | 3/1996 | Harata et al. ............... 257/62.3 |
| 5,786,027 A | * | 7/1998 | Rolfson ....................... 427/124 |
| 5,798,137 A | * | 8/1998 | Lord et al. ................... 427/213 |
| 6,190,961 B1 | * | 2/2001 | Lam et al. .................. 438/253 |
| 6,227,140 B1 | * | 5/2001 | Kennedy et al. ........ 118/723 R |

FOREIGN PATENT DOCUMENTS

| | | |
|---|---|---|
| DE | 3809101 A1 | 9/1989 |
| EP | 61148815 A | 7/1986 |
| EP | 61154025 A | 7/1986 |
| EP | 61224312 A | 10/1986 |
| EP | 0628644 A2 | 12/1994 |
| FR | 2111630 A | 6/1972 |
| WO | WO 0004574 A1 | 1/2000 |

OTHER PUBLICATIONS

International Search Report PCT/US 01/20102.

* cited by examiner

*Primary Examiner*—Bret Chen
(74) *Attorney, Agent, or Firm*—Blakely Sokoloff Taylor & Zafman (57) ABSTRACT

A method of forming a polycrystalline silicon film comprising:
  providing a process gas mix comprising a silicon source gas and a dilution gas mix wherein the dilution gas mix comprises H2 and an inert gas; and
  forming a polycrystalline silicon film from said silicon source gas.

28 Claims, 6 Drawing Sheets

METHOD OF CONTROLLING THE CRYSTAL STRUCTURE OF POLYCRYSTALLINE SILICON

BACKGROUND OF THE INVENTION

1. Field of the Invention

The present invention relates to the field of a semiconductor processing and more specifically to a method and apparatus for controlling the crystal structure of a silicon film.

2. Discussion of Related Art

Figure 6:
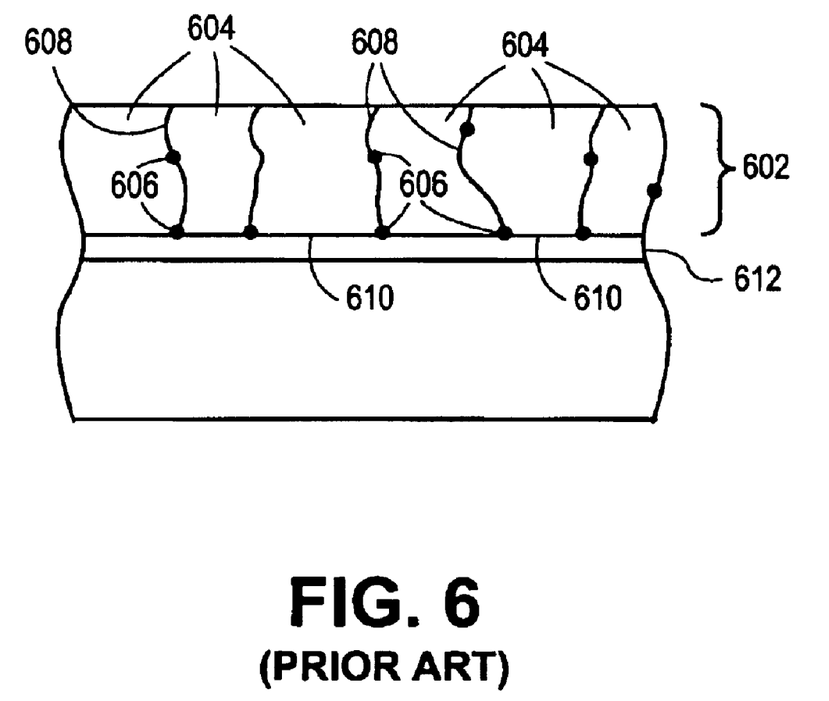
FIG. 6 is an illustration showing a prior art polysilicon film with large and columnar grains.

In order to fabricate more complex and higher density integrated circuits such as microprocessors and memories, device features must be continually reduced. An important feature which must be reduced in order to increase device density is the polysilicon gate lengths and correspondingly the polysilicon thickness of MOS transistors. Present polysilicon deposition processes form polysilicon films 602 having large and columnar grains 604 as shown in FIG. 6. As transistor gate lengths are shrunk to less than 0.18 microns the large and columnar grains 604 are beginning to play a critical role in the performance of the transistor. Dopants 606 which are subsequently added to the polysilicon film in order to reduce the resistance of the film utilize the grain boundaries 608 to diffuse throughout the polysilicon film 602. Because in prior art processes the grains 604 are large and columnar dopant diffusion is restricted causing areas 610 of undoped polysilicon, especially at the polysilicon 602/gate dielectric 612 interface. The lack of uniform distribution of dopants, known as poly depletion effects, detrimentally affects the performance of the fabricated transistor especially as a gate lengths decrease to below 0.18 microns.

Thus, what it desired a method of forming a polysilicon film with small and random grains so that narrow width gate length electrodes can be fabricated without suffering from poly depletion effects.

SUMMARY OF THE INVENTION

A method and apparatus for forming a polycrystalline silicon film. According to the present invention a process gas mix comprising a silicon source gas and a dilution gas mix is fed into a chamber wherein the dilution gas mix comprises $H_2$ and an inert gas. A polycrystalline silicon film is then formed from the process gas mix.

DETAILED DESCRIPTION OF THE PRESENT INVENTION

In the following description, for the purposes of explanation, numerous specific details are set forth in order to provide a thorough understanding of the present invention. It will be evident, however, to one skilled in the art that the present invention may be practiced without these specific details. In certain instances specific apparatus structures and methods have not been described so as not to obscure the present invention.

The present invention is a method and apparatus for depositing a polycrystalline silicon film. According to the present invention a substrate or wafer is placed onto a support in a chamber. The support is then heated and a desired pressure maintained in the chamber. A process gas mix comprising a silicon source gas such as but not limited to silane ($SiH_4$) or disilane ($Si_2H_6$) and a dilution gas mix comprising $H_2$ and inert gas such as but not limited to nitrogen ($N_2$), helium (He), and argon (Ar) is then fed into the chamber. The hydrogen gas typically comprises between 8–20% of the dilution gas mix by volume and preferably between 10–15% by volume. Heat from the substrate or support causes the silicon source gas to thermally decompose and form a polycrystalline silicon film on the wafer. Because $H_2$ is included in the dilution gas mix the crystalline orientation of the deposited silicon is dominated by the <111> orientation as opposed to the <220> orientation. The process of the present invention produces a polycrystalline silicon film having a random grain structure as opposed to a columnar structure and has an average grain size between 50–500 Å. A random grain polycrystalline silicon film is ideal for use as a gate electrode because during subsequent ion implantation steps dopants can easily and uniformly diffused through the small grains to the gate/gate oxide interface and thereby eliminating poly depletion effects. Additionally, the random grain polysilicon film of the present invention is also useful in the formation of polysilicon/tungsten silicide films for electrodes or interconnects because the small random grain structure of the silicon film can be a very affective barrier to blocking fluorine from penetrating into the gate dielectric during the deposition of a tungsten or tungsten silicide film by chemical vapor deposition (CVD) using tungsten hexaflouride ($WF_6$). The polycrystalline silicon deposition process of the present invention is ideal for use in a thermal deposition chamber having aluminum sidewalls and an aluminum nitride wafer support with a resistive heater contained therein and with an overhead shower head for gas injection into the chamber.

Although the present invention is described relative to a resistively heated processing chamber, it is to be appreciated that other types of processing chambers may be used in conjunction with the techniques described herein.

Figure 1:
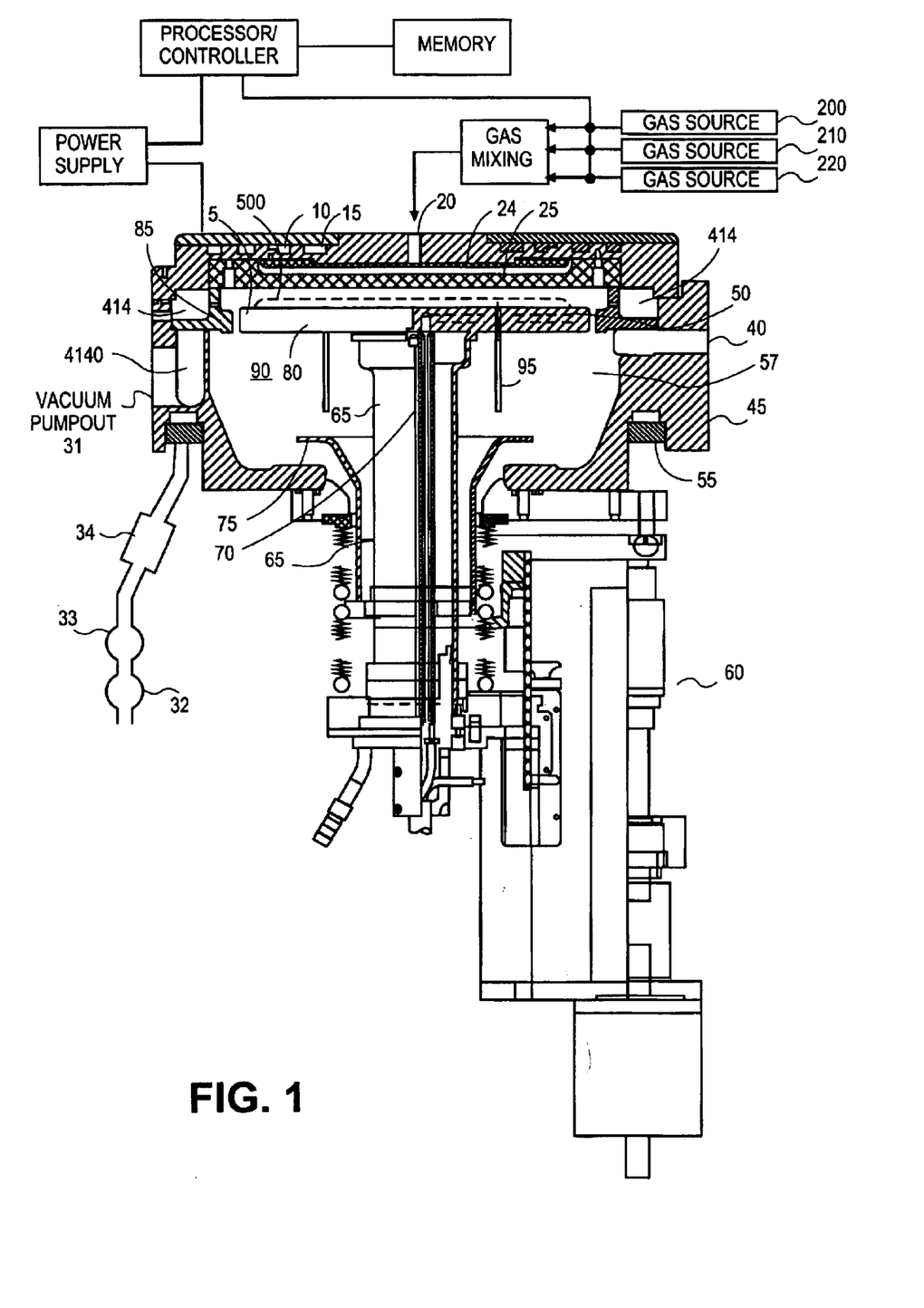
FIG. 1 shows an illustration of a cross-sectional side view a processing chamber comprising of a resistive heater in a "wafer-process" position in accordance with embodiment of the invention through first cross-section and a second cross-section each through one-half of the chamber.
Figure 2:
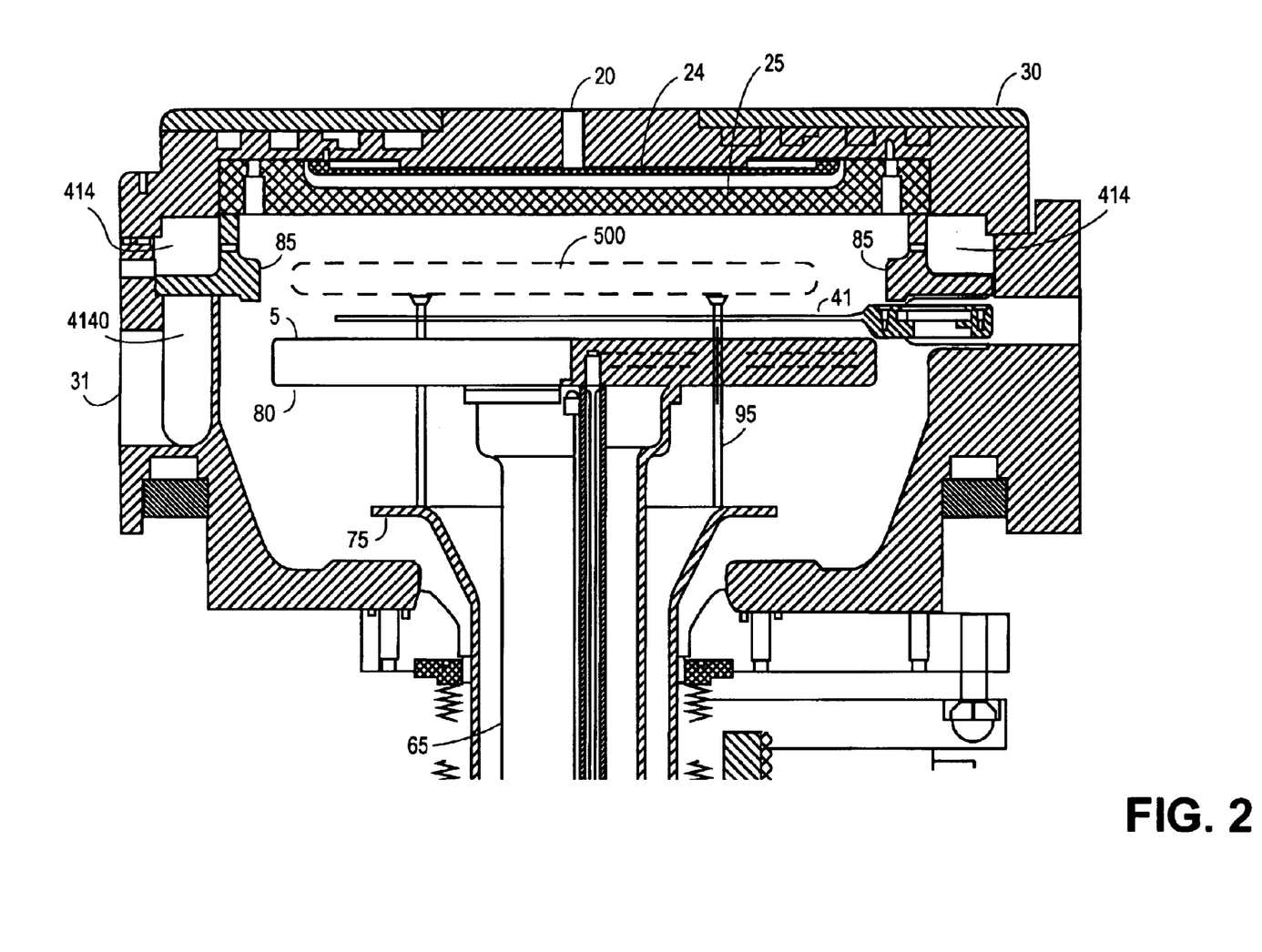
FIG. 2 shows an illustration of a similar cross-sectional side view as in FIG. 1 in a wafer separate position.
Figure 3:
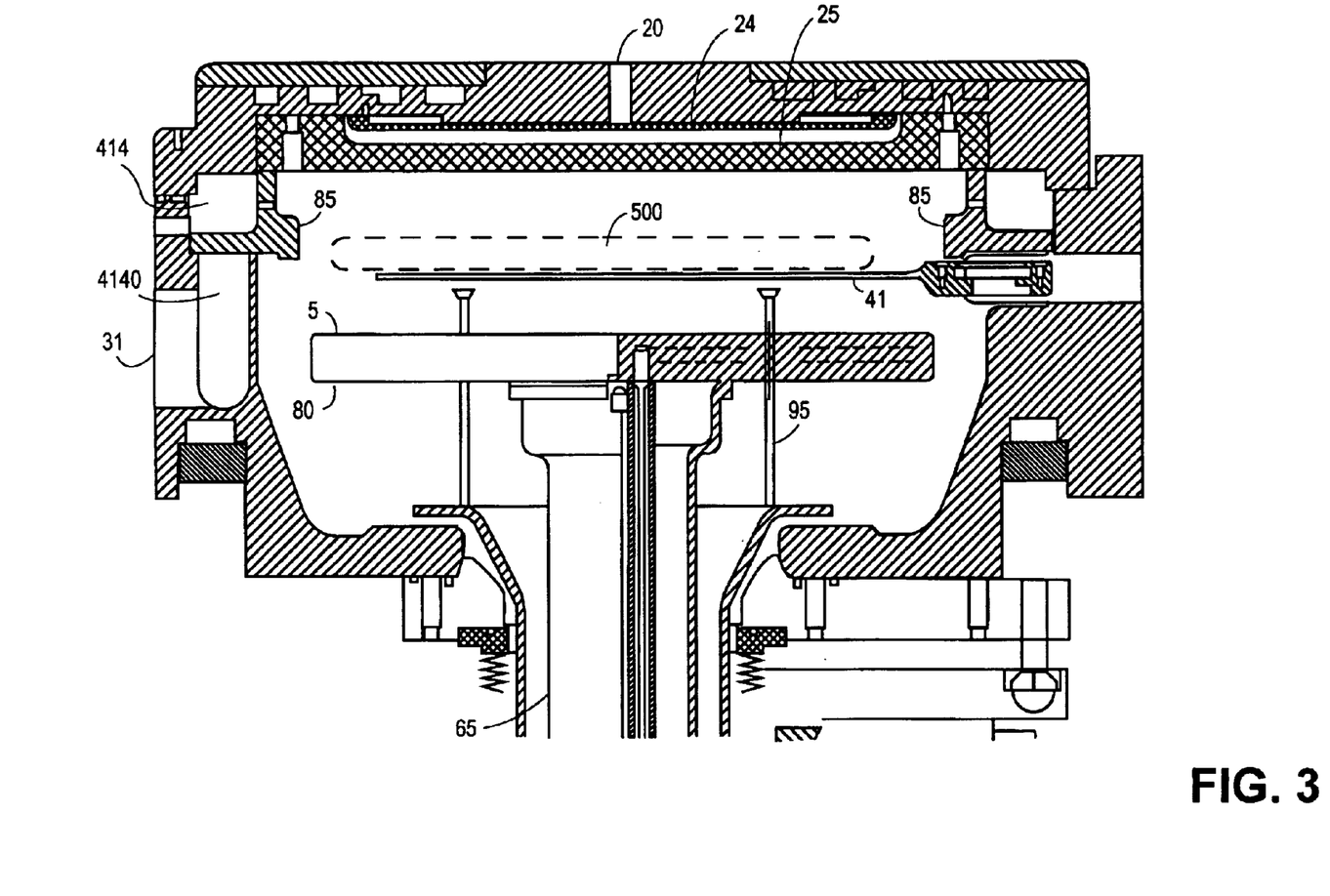
FIG. 3 shows an illustration of a similar cross-sectional side view as in FIG. 1 in a wafer load position.

Referring to the drawings, a low-pressure chemical vapor deposition (LPCVD) chamber is described. FIGS. 1–3 each show cross-sectional views of one type of reactor such as a resistive reactor used to practice the invention. FIGS. 1–3 each show cross-sectional views of a chamber through two different cross-sections, each cross-section representing a view through approximately one-half of the chamber.

The LPCVD chamber 100 illustrated in FIGS. 1–3 is constructed of materials such that, in this embodiment, a pressure of greater than or equal to 100 Torr can be maintained. For the purpose of illustration, a chamber of approximately in the range of 5–6 liters is described. FIG. 1 illustrates the inside of process chamber body 45 in a "wafer-process" position. FIG. 2 shows the same view of the chamber in a "wafer-separate" position. FIG. 3 shows the same cross-sectional side view of the chamber in a "wafer-load" position. In each case, a wafer 500 is indicated in dashed lines to indicate its location in the chamber.

FIGS. 1–3 show chamber body 45 that defines reaction chamber 90 in which the thermal decomposition of a process gas or gases takes place to form a film on a wafer (e.g., a CVD reaction). Chamber body 45 is constructed, in one embodiment, of aluminum and has passages 55 for water to be pumped therethrough to cool chamber 45 (e.g., a "cold-wall" reaction chamber). Resident in chamber 90 is resistive heater 80 including, in this view, susceptor 5 supported by shaft 65. Susceptor 5 has a surface area sufficient to support a substrate such as a semiconductor wafer 500 (shown in dashed lines).

Process gas enters otherwise sealed chamber 90 through gas distribution port in a top surface of chamber lid 30 of chamber body 45. The process gas then goes through blocker plate 25 to distribute the gas about an area consistent with the surface area of a wafer. Thereafter, the process gas is distributed through perforated face plate 25 located, in this view, above resistive heater 80 and coupled to chamber lid 30 inside chamber 90. One objective of the combination of blocker plate 24 with face plate 25 in this embodiment is to create a uniform distribution of process gas at the substrate, e.g., wafer.

A substrate 500, such as a wafer, is placed in chamber 90 on susceptor 5 of heater 80 through entry port 40 in a side portion of chamber body 45. To accommodate a wafer for processing, heater 80 is lowered so that the surface of susceptor 5 is below entry port 40 as shown in FIG. 3. Typically by a robotic transfer mechanism, a wafer is loaded by way of, for example, a transfer blade 41 into chamber 90 onto the superior surface of susceptor. Once loaded, entry 40 is sealed and heater 80 is advance in a superior (e.g., upward) direction toward face plate 25 by lifter assembly 60 that is, for example, a step motor. The advancement stops when the wafer 500 is a short distance (e.g., 400–700 mils) from face plate 25 (see FIG. 1). In the wafer-process position, chamber 90 is effectively divided into two zones, a first zone above the superior surface of susceptor 5 and a second zone below the inferior surface of susceptor 5. It is generally desirable to confine polysilicon film formation to the first zone.

At this point, process gas controlled by a gas panel flows into chamber 90 through gas distribution port 20, through blocker plate 24 and perforated face plate 25. Process gas thermally decomposes to form a film on the wafer. At the same time, an inert bottom-purge gas, e.g., nitrogen, is introduced into the second chamber zone to inhibit film formation in that zone. In a pressure controlled system, the pressure in chamber 90 is established and maintained by a pressure regulator or regulators coupled to chamber 90. In one embodiment, for example, the pressure is established and maintained by baretone pressure regulator(s) coupled to chamber body 45 as known in the art. In this embodiment, the baretone pressure regulator(s) maintains pressure at a level of equal to or greater than 150 Torr.

Residual process gas is pumped from chamber 90 through pumping plate 85 to a collection vessel at a side of chamber body 45 (vacuum pumpout 31). Pumping plate 85 creates two flow regions resulting in a gas flow pattern that creates a uniform silicon layer on a substrate.

Pump 32 disposed exterior to apparatus provides vacuum pressure within pumping channel 4140 (below channel 414 in FIGS. 1–3) to draw both the process and purge gases out of the chamber 90 through vacuum pump-out 31. The gas is discharged from chamber 90 along a discharge conduit 33. The flow rate of the discharge gas through channel 4140 is preferably controlled by a throttle valve 34 disposed along conduit 33. The pressure within processing chamber 90 is monitored with sensors (not shown) and controlled by varying the cross-sectional area of conduit 33 with throttle valve 34. Preferably, a controller or processor receives signals from the sensors that indicate the chamber pressure and adjusts throttle valve 34 accordingly to maintain the desired pressure within chamber 90. A suitable throttle valve for use with the present invention is described in U.S. Pat. No. 5,000,225 issued to Murdoch and assigned to Applied Materials, Inc., the complete disclosure by which is incorporated herein by reference.

Once wafer processing is complete, chamber 90 may be purged, for example, with an inert gas, such as nitrogen. After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of chamber 90. As is illustrated in FIG. 2, in one embodiment, at the point, life plate 75 remains at a wafer-process position (i.e., the same position the plate was in FIG. 1). As heater 80 continues to move in an inferior direction through the action of assembly 60, lift pins 95 remain stationary and ultimately extend above the susceptor or top surface of susceptor 5 to separate a processed wafer from the surface of susceptor 5. The surface of susceptor 5 is moved to a position below opening 40.

Once a processed wafer is separated from the surface susceptor 5, transfer blade 41 of a robotic mechanism is inserted through opening 40 beneath the heads of lift pins 95 and a wafer supported by the lift pins. Next, lifter assembly 60 inferiorly moves (e.g., lowers) heater 80 and lifts plate 75 to a "wafer load" position. By moving lift plates 75 in an inferior direction, lift pins 95 are also moved in an inferior direction, until the surface of the processed wafer contacts the transfer blade. The processed wafer is then removed through entry port 40 by, for example, a robotic transfer mechanism that removes the wafer and transfers the wafer to the next processing step. A second wafer may then be loaded into chamber 90. The steps described above are generally reversed to bring the wafer into a process position. A detailed description of one suitable lifter assembly 60 is described in U.S. Pat. No. 5,772,773, assigned to Applied Materials, Inc. of Santa Clara, Calif.

In a high temperature operation, such as LPCVD processing to form a polycrystalline silicon film, the heater temperature inside chamber 90 can be as high as 750° C. or more. Accordingly, the exposed components in chamber 90 must be compatible with such high temperature processing. Such materials should also be compatible with such high temperature processing. Such materials should also be compatible with the process gases and other chemicals, such as cleaning chemicals (e.g., $NF_3$) that may be introduced into chamber 90. Exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride materials (on the order of 95% purity with a thermal conductivity from 140 W/mK) while shaft 65 is comprised of a lower thermally conductive aluminum nitride. Susceptor 5 of heater 80 is typically bonded to shaft 65 through diffusion bonding or brazing as such coupling will similarly withstand the environment of chamber 90.

FIG. 1 also shows a cross-section of a portion of heater 80, including a cross-section of the body of susceptor 5 and a cross-section of shaft 65. In this illustration, FIG. 1 shows the body of susceptor 5 having two heating elements formed therein, first heating element 50 and second heating element 57. Each heating element (e.g., heating element 50 and heating element 57) is made of a material with thermal expansion properties similar to the material of the susceptor. A suitable material includes molybdenum (Mo). Each heating element includes a thin layer of molybdenum material in a coiled configuration.

In FIG. 1, second heating element 57 is formed in a plane of the body of susceptor 5 that is located inferior (relative to the surface of susceptor in the figure) to first heating element 50. First heating element 50 and second heating element 57 are separately coupled to power terminals. The power terminals extend in an inferior direction as conductive leads through a longitudinally extending opening through shaft 65 to a power source that supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

Figure 4:
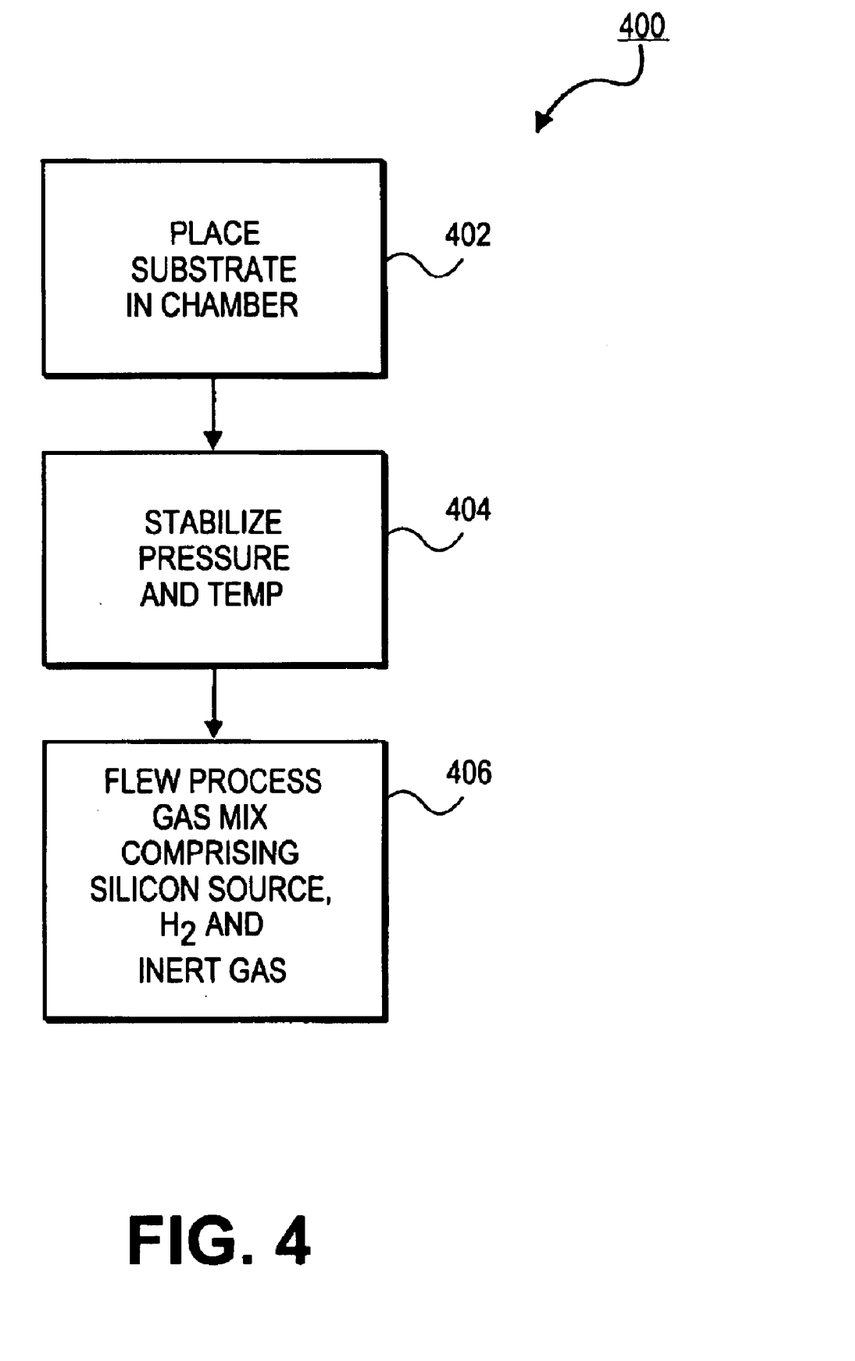
FIG. 4 is a flow chart illustrating an embodiment of the polysilicon deposition process of the present invention.

A method of depositing a polycrystalline silicon film with small and random grains will now be described with respect to flow chart 400 of FIG. 4 as well as with respect to the low-pressure chemical vapor deposition (LPCVD) chamber of FIGS. 1–3.

Figure 5A:
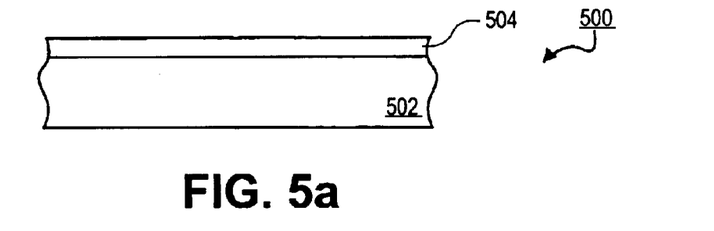
FIG. 5*a* is an illustration of substrate having a gate dielectric or an interlayer dielectric formed on a silicon wafer.

According to the present invention, as set forth in block 402 of flow chart 400, first a wafer or substrate is placed in deposition chamber 90. In an embodiment of the present invention where the deposited polycrystalline silicon film is to be used as a gate electrode for a transistor of a semiconductor integrated circuit, the substrate 500 will be a doped silicon wafer 502 having a gate dielectric layer 504, such as silicon oxide or silicon oxynitride formed thereon as shown in FIG. 5a. If the polysilicon film is to used as an interconnect or capacitor electrode then the polysilicon film will be formed over an interlayer dielectric 504 formed over a doped silicon wafer 502. Wafer 500 is transferred into chamber 90 by a transfer blade 41 as shown in FIG. 3. The heater is then raised from the wafer load position to the wafer process position as shown in FIG. 1.

Next, as set forth in block 404, the desired deposition pressure and temperature are obtained and stabilized in chamber 90. While achieving pressure and temperature stabilization, a stabilization gas such as $N_2$, He, Ar, $H_2$ or combinations thereof are fed into chamber 90. In a preferred embodiment of the present invention the flow and concentration of the dilution gas used in the subsequent polysilicon deposition is used to achieve temperature and pressure stabilization. Using the dilution gas for stabilization enables the dilution gas flow and concentrations to stabilize prior to polysilicon deposition.

In an embodiment of the present invention the chamber is evacuated to a pressure between 150–350 Torr with 200–275 Torr being preferred and the heater temperature raised to between 700–740° C. and preferably between 710–720° C. while the dilution gas is fed into chamber 90 at a flow rate between 10–30 slm. According to the present invention the dilution gas consist of $H_2$ and an inert gas, such as but not limited to nitrogen ($N_2$), argon (Ar), and helium (He), and combinations thereof. For the purpose of the present invention an inert gas is a gas which is not consumed by or which does not interact with the reaction used to deposit the polysilicon film and does not interact with chamber components during polysilicon film deposition. In a preferred embodiment of the present invention the inert gas consist only of nitrogen ($N_2$). In an embodiment of the present invention $H_2$ comprises more than 8% and less than 20% by volume of the dilution gas mix with the dilution gas mix preferably having between 10–15% $H_2$ by volume.

The present invention the dilution gas mix has a sufficient $H_2$/inert gas concentration ratio such that a subsequently deposited polysilicon film is dominated by the <111> crystal orientation as compared to the <220> crystal orientation. Additionally, the dilution gas mix has a sufficient $H_2$/inert gas concentration ratio so that the subsequently deposited polycrystalline silicon film has a random grain structure with an average grain size between 50–500 Å.

In an embodiment of the present invention the dilution gas mix is supplied into chamber 90 in two separate components. A first component of the dilution gas mix is fed through distribution port 20 in chamber lid 30. The first component consist of all the $H_2$ used in the dilution gas mix and a portion (typically about ⅔) of the inert gas used in the dilution gas mix. The second component of the dilution gas mix is fed into the lower portion of chamber 90 beneath heater 80 and consists of the remaining portion (typically about ⅓) of the inert gas used in the dilution gas mix. The purpose of providing some of the inert gas through the bottom chamber portion is to help prevent the polycrystalline silicon film from depositing on components in the lower portion of the chamber. In the embodiment of the present invention between 8–18 slm with about 9 slm being preferred of an inert gas (preferably $N_2$) is fed through the top distribution plate 20 while between 3–10 slm, with 4–6 slm being preferred, of the inert gas (preferably $N_2$) is fed into the bottom or lower portion of chamber 90. The desired percentage of $H_2$ in the dilution gas mix is mixed with the inert gas prior to entering distribution port 20.

Figure 5B:
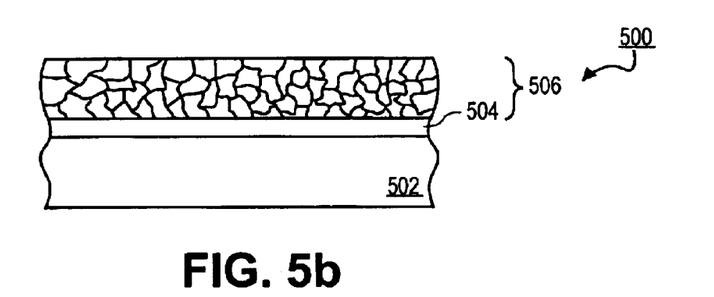
FIG. 5*b* is an illustration showing the formation of a small and random grain polycrystalline silicon film formed on the substrate of FIG. 5*a*.

Next, once the temperature, pressure, and gas flows have been stabilized a process gas mix comprising a silicon source gas and a dilution gas mix comprising $H_2$ and an inert gas is fed into chamber 90 to deposit a polycrystalline silicon film 506 on substrate 500 as shown in FIG. 5b. In the preferred embodiment of the present invention the silicon source gas is silane ($SiH_4$) but can be other silicon source gases such as disilane ($Si_2H_6$). According to the preferred embodiment of the present invention between 50–150 sccm, with between 70–100 sccm being preferred, of silane ($SiH_4$) is added to the dilution gas mix already flowing and stabilized during the temperature and pressure stabilization step 404. In this way during the deposition of polysilicon, a process gas mix comprising between 50–150 sccm of silane ($SiH_4$) and between 10–30 slm of dilution gas mix comprising $H_2$ and an inert gas is fed into the chamber while the pressure in chamber 90 is maintained between 150–350 Torr and the temperature of susceptor 5 is maintained between 700–740° C. (It is to be appreciated that in the LPCVD reactor 100 the temperature of the substrate or wafer 500 is typically about 50° cooler than the measured temperature of susceptor 5). In the preferred embodiment of the present invention the silicon source gas is added to the first component (upper component) of the dilution gas mix and flows into chamber 90 through inlet port 20.

The thermal energy from susceptor 5 and wafer 500 causes the silicon source gas to thermally decompose and deposit a polysilicon film on gate dielectric or interlayer dielectric 504 on silicon wafer 502 as shown in FIG. 5b. In an embodiment of the present invention only thermal energy is used to decompose the silicon source gas without the aid of additional energy sources such as plasma or photon enhancement.

As process gas mix is fed into chamber 90, the silicon source gas decomposes to provide silicon atoms which in turn form a polycrystalline silicon film on insulating layer 504. It is to be appreciated that $H_2$ is a reaction product of the decomposition of silane ($SiH_4$). By adding a suitable amount of $H_2$ in the process gas mix the decomposition of silane ($SiH_4$) is slowed which enables a polycrystalline silicon film 506 to be formed with small and random grains 507. In the present invention $H_2$ is used to manipulate the silicon resource reaction across the wafer. By having $H_2$ comprise between 8–20% of the dilution gas mix random grains having an average grain size between 50–500 Å can be formed. Additionally, by including a sufficient amount of $H_2$ in the dilution gas mix a polycrystalline silicon film 506 which is dominated by the <111> crystal orientation, as opposed to the <220> crystal orientation is formed.

According to the present invention the deposition pressure, temperature, and process gas flow rates and concentration are chosen so that a polysilicon film is deposited at a rate between 1500–5000 Å per minute with between 2000–300 Å per minute being preferred. The process gas mix is continually fed into chamber 90 until a polysilicon film 506 of a desired thickness is formed. For gate and interconnect applications a polysilicon film 506 having a thickness between 500–2000 Å has been found suitable.

After completing the deposition polysilicon film 506, heater 80 is lowered from the process position to the load position and wafer 500 removed from chamber 90.

Figure 5C:
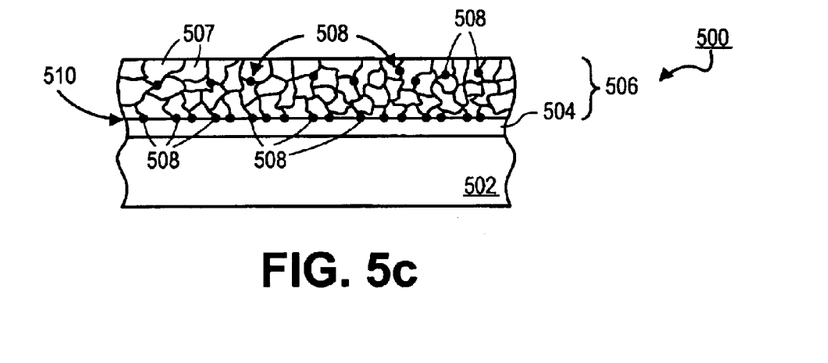
FIG. 5*c* is an illustration showing the ion implantation and diffusion of dopants into the substrate of FIG. 5*b*.

At this time further processing of substrate 500 can be implemented to form a desired feature or features from polysilicon film 506. For example, in the case of polysilicon gate electrode, polysilicon film 506 can be transferred to an ion implantation machine where P type dopants (boron) or N type dopants (phosphorus or arsenic) are implanted into the polysilicon film to increase the conductivity of the film. Because polysilicon film 506 comprises small and random grains, subsequent anneals used to drive the dopants 508 can easily and uniformly drive the dopants 508 to the polysilicon/gate oxide interface 510 as shown in FIG. 5c where they are most necessary. The small grains 507 enable a uniform placement of dopants without creating areas of undoped poly which can lead to undesired poly depletion effects (high resistant areas) which detrimentally impact the performance of the fabricated transistor. In prior art polysilicon deposition processes which formed large columnar shaped grains, as shown in FIG. 6, subsequent ion implantation and anneal steps can leave pockets 610 of undoped silicon at the polysilicon interface which can lead to poly depletion effects and poor device performance.

Figure 5D:
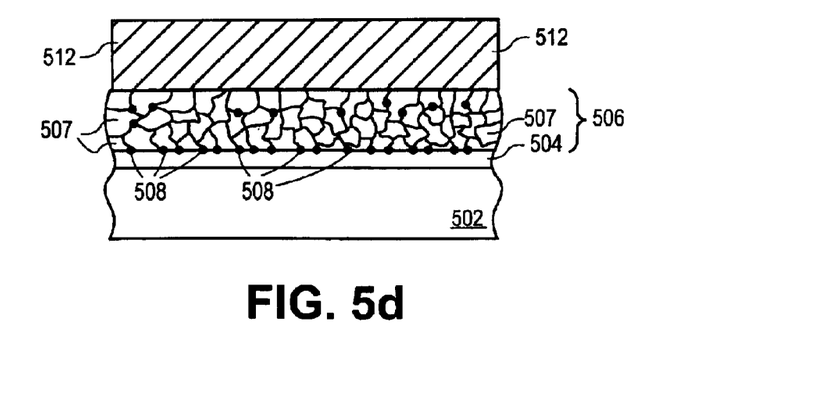
FIG. 5*d* is an illustration showing the formation of a tungsten or tungsten silicide film on the substrate of FIG. 5*c*.

Additionally, the small and random grain boundaries 507 also enable the deposition of the tungsten or tungsten silicide film onto polysilicon film 506. For example, in the fabrication of gate electrodes, capacitor electrodes, and interconnects at times it is desirable to further reduced the resistance of a doped polysilicon film by forming a tungsten or tungsten silicide film 512 onto the doped polysilicon as shown in FIG. 5d. A tungsten film can be formed by chemical vapor deposition (CVD) utilizing $WF_6$ and $H_2$ and a tungsten silicide film can be formed by CVD utilizing $WF_6$ and silane ($SiH_4$) or dichlorosilane (DCS). During the decomposition of $WF_6$, undesired flourine ions can penetrate the polysilicon films with large columnar grains and affect the integrety of the gate dielectric layer. However, in the present invention the small and random grain structure 507 of polysilicon 506 provides an effective barrier for preventing flourine from reaching the gate dielectric layer. Thus, the small and random grains of polysilicon film 506 enables the direct deposition of a tungsten of tungsten silicide film 512 by CVD sing $WF_6$ onto polysilicon film 506 without causing reliability issues.

After ion implanting and/or forming a tungsten film on polysilicon film 506 well-known photolithography and etching techniques can used to pattern polysilicon 506 and a tungsten or tungsten silicide film 512 into a gate electrode, an interconnect, or capacitor electrode as desired. Thus, the polysilicon deposition process of the present invention enables uniform doping of a polysilicon film without polysilicon depletion affects and enables the direct deposition of a tungsten or tungsten silicide film by CVD onto a polysilicon film without affecting the quality of the gate dielectric layer.

LPCVD chamber 100 includes a processor/controller 700 and a memory 702, such as a hard disk drive. The processor/controller 700 includes a single board (SBC) analog and digital input/output boards, interface boards and stepper motor controller board. Processor/controller 700 controls all activity of the LPCVD chamber. The system controller executes system control software, which is a computer program stored in a computer readable medium such as memory 702. The computer program includes sets of instructions that dictate the timing, mixture of gases, chamber pressure, heater temperature, power supply, susceptor position, and other parameters of the polysilicon deposition process of the present invention. The computer program code can be written in any conventional computer readable programming language such as 68000 assembly language, C, C++, Pascal, Fortran, or others. Subroutines for carrying out process gas mixing, pressure control, and heater control are stored within memory 702. Also stored in memory 702 are process parameters such as process gas flow rates and compositions, temperatures, and pressures necessary to form a polycrystalline silicon film having a random grain structure as described above. Thus, according to the present invention LPCVD chamber 100 includes in memory 702 instructions and process parameters for: providing a silicon source gas and a dilution gas mix into chamber 90 wherein the dilution gas mix comprises $H_2$ and an inert gas; for heating the susceptor 5 to a temperature between 700–740° C.; and for generating a pressure between 150–350 torr polycrystalline silicon film be deposited by thermal chemical vapor deposition onto a wafer.

Thus, a method of forming a polycrystalline silicon film with small and random grain boundaries has been described.

We claim:

1. A method of depositing a polycrystalline silicon film having a random grain silicon comprising:

providing a substrate on a wafer support in a chamber;

heating said substrate to a temperature greater than 650° C.;

flowing a silicon source gas into said chamber;

following a dilution gas mix into said chamber wherein the dilution gas mix comprises $H_2$ and an inert gas in such a concentration ratio that a polycrystalline silicon film having random grains is formed during deposition; and depositing said random grain polycrystalline silicon film on said substrate by thermally decomposing said silicon source gas in said chamber while flowing said silicon source gas and said dilution gas mix into said chamber and heating said substrate to said temperature.

2. The method of claim 1 wherein said inert gas is selected from the group consisting of nitrogen ($N_2$), helium (He) and Argon (Ar).

3. The method of claim 1 wherein $H_2$ comprises less than 20% of said dilution gas mix by volume.

4. The method of claim 1 wherein $H_2$ comprises more than 8% of said dilution gas mix.

5. The method of claim 1 wherein $H_2$ comprises between 10–15% of said dilution gas mix.

6. The method of claim 1 wherein said dilution gas mix has an $H_2$/inert gas volume concentration ratio such that said polycrystalline silicon film is deposited with a random grain structure with an average grain size between 50–500 Å.

7. The method of claim 1 wherein said polycrystalline silicon is dominated by the <111> crystalline orientation.

8. The method of claim 1 wherein said silicon source gas is silans ($SiH_4$).

9. A method of depositing a random grain polycrystalline silicon film comprising:

placing a substrate on a support in a chamber;

heating said support to a temperature between 700–740° C.;

generating a pressure between 150–350 torr in said chamber; flowing a silicon source gas into said chamber;

flowing a dilution gas mix wherein said dilution gas mix comprises $H_2$ and $N_2$ in such a concentration ratio that a polycrystalline silicon film having random grains is formed during deposition; and depositing said random grain polycrystalline silicon film on said substrate by thermally decomposing said silicon source gas in said chamber while flowing said silicon source gas and said dilution gas mix into said chamber and heating said support to said temperature and generating said pressure.

10. The method of claim 9 wherein $H_2$ comprises less than 20% of said dilution gas mix.

11. The method of claim 9 wherein $H_2$ comprises more than 8% of said dilution gas mix.

12. The method of claim 9 wherein $H_2$ comprises between 10–15% of said dilution gas mix.

13. The method of claim 9 wherein said dilution gas mix has an $H_2/N_2$ concentration ratio such that said polycrystalline silicon film is deposited with a random grain structure with an average grain size between 50–500 Å.

14. The method of claim 9 wherein said polycrystalline silicon is dominated by the <111> crystalline orientation.

15. The method of claim 9 wherein said silicon source gas is silane ($SiH_4$).

16. The method of claim 9 wherein said dilution gas has a flow rate of between 10–30 slm into said chamber while said silane gas has a flow rate of between 50–150 sccm.

17. The method of claim 9 wherein said dilution gas has a flow rate of between 12–20 slm into said chamber while said silane gas has a flow rate of between 70–100 sccm.

18. The method of claim 9 wherein said dilution gas mix and said silicon source gas are fed into said chamber at a concentration and temperature to deposit a said polycrystalline silicon film at a rate between 1000–5000 Å per minute.

19. A method of depositing a random grain polycrystalline silicon film comprising:

placing a substrate into a chamber having aluminum sidewalls and an aluminum nitride substrate support having a resistive heater contained therein;

heating said substrate to a temperature greater than 650° C.; flowing a silicon source gas into said chamber;

flowing a dilution gas mix into said chamber wherein said dilution gas mix comprises $H_2$ and $N_2$ in such a concentration ratio that a polycrystalline silicon film having random grains is formed during deposition; and depositing said random grain polycrystalline silicon film on said substrate by thermally decomposing said silicon source gas in said chamber while providing said process gas mix into said chamber and while heating said substrate to said temperature.

20. The method of claim 19 further comprising providing a flow of $N_2$ gas into said chamber from below said substrate support wherein said process gas mix flow and said flow of $N_2$ is the total gas flow into said chamber.

21. The method of claim 20 wherein $H_2$ comprises less than 20% of said total gas flow into said chamber.

22. The method of claim 20 wherein $H_2$ comprises more than 8% of said total gas flow into said chamber.

23. The method of claim 20 wherein $H_2$ comprises between 10–15% of said total gas flow into said chamber.

24. A method of depositing a doped random grain polycrystalline silicon gate electrode comprising:

placing a substrate into a chamber;

heating said substrate to a temperature greater than 650° C.;

flowing a silicon source gas into said chamber wherein said dilution gas mix comprises $H_2$ and an inert gas in such a concentration ratio that a polycrystalline silicon film having random grains is formed during deposition;

depositing said random grain polycrystalline silicon film on said substrate by thermally decomposing said silicon source gas in said chamber while flowing said silicon source gas and said dilution gas mix into said chamber and while heating said substrate; and implanting dopants into said random grain polycrystalline silicon film.

25. A method of forming a composite tungsten/polycrystalline silicon film comprising:

placing a substrate into a chamber;

heating said substrate to a temperature greater than 650° C.;

flowing a silicon source gas into said chamber wherein said dilution gas mix comprises $H_2$ and an inert gas in such a concentration ratio that a polycrystalline silicon film having random grains is formed during deposition;

depositing said random grain polycrystalline silicon film on said substrate by thermally decomposing said silicon source gas in said chamber while flowing said silicon source gas and said dilution gas mix into said chamber and while heating said substrate to said temperature; and forming a tungsten or tungsten suicide film on said random grain polycrystalline silicon film utilizing a reactant gas mix comprising $WF_6$.

26. A method of depositing a random grain polycrystalline silicon film comprising:

placing a substrate on a support in a chamber;

heating said support to a temperature between 700–740° C.;

generating a pressure between 150–350 torr in said chamber;

flowing a silicon source gas into said chamber wherein said dilution gas mix comprises $H_2$ and an inert gas in such a concentration ratio that a polycrystalline silicon film having random grains is formed during deposition; and depositing said random grain polycrystalline silicon film on said substrate by thermally decomposing said silicon source gas in said chamber while flowing said silicon source gas and said dilution gas mix and while heating said support to said temperature and while generating said pressure.

27. A method of depositing a random grain polycrystalline silicon film comprising:

placing a substrate on a support in a chamber;
heating said substrate;
generating a pressure between 150–350 torr in said chamber;

flowing a silicon source gas into said chamber wherein said dilution gas mix comprises $H_2$ and an inert gas in such a concentration ratio that a polycrystalline silicon film having random grains is formed during deposition; and depositing said random grain polycrystalline silicon film on said substrate by thermally decomposing said silicon source gas in said chamber while flowing said silicon source gas and said dilution gas mix and while generating said pressure.

28. A method of depositing a random grain polycrystalline silicon film comprising:

placing a substrate on a support in a chamber;

heating said support to a temperature between 700–740° C.;

flowing a silicon source gas into said chamber wherein said dilution gas mix comprises $H_2$ and an inert gas in such a concentration ratio that a polycrystalline silicon film having random grains is formed during deposition; and depositing said random grain polycrystalline silicon film on said substrate by thermally decomposing said silicon source gas in said chamber flowing said silicon source gas and said dilution gas mix and while heating said support to said temperature.

* * * * *